(12) United States Patent
Na

(10) Patent No.: US 11,335,398 B2
(45) Date of Patent: *May 17, 2022

(54) INTEGRATED CIRCUIT AND MEMORY

(71) Applicant: SK hynix Inc., Gyeonggi-do (KR)

(72) Inventor: Jeong-Jik Na, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/084,910

(22) Filed: Oct. 30, 2020

(65) Prior Publication Data

US 2021/0050050 A1 Feb. 18, 2021

Related U.S. Application Data

(63) Continuation-in-part of application No. 16/713,336, filed on Dec. 13, 2019, now Pat. No. 10,872,657.

(30) Foreign Application Priority Data

Dec. 26, 2018 (KR) .......................... 10-2018-0169387

(51) Int. Cl.
*G11C 7/22* (2006.01)
*G11C 11/4091* (2006.01)
*G11C 11/4076* (2006.01)
*G11C 11/4074* (2006.01)
*G11C 11/4094* (2006.01)

(52) U.S. Cl.
CPC ...... *G11C 11/4091* (2013.01); *G11C 11/4074* (2013.01); *G11C 11/4076* (2013.01); *G11C 11/4094* (2013.01)

(58) Field of Classification Search
CPC .................................................. G11C 11/4091
See application file for complete search history.

(56) References Cited

U.S. PATENT DOCUMENTS

| 7,633,822 | B2* | 12/2009 | Seo | .......................... G11C 7/22 |
| | | | | 365/208 |
| 10,872,657 | B2* | 12/2020 | Na | ....................... G11C 11/4094 |
| 2012/0127811 | A1* | 5/2012 | Kawasumi | ............... G11C 7/08 |
| | | | | 365/194 |

FOREIGN PATENT DOCUMENTS

KR         10-0184449         4/1999

* cited by examiner

*Primary Examiner* — Min Huang
(74) *Attorney, Agent, or Firm* — IP & T Group LLP

(57) ABSTRACT

An integrated circuit may include an amplifier circuit configured to receive a pull-up voltage in response to a pull-up enable signal, receive a pull-down voltage in response to a pull-down enable signal, and amplify a voltage difference between a first line and a second line through the pull-up and pull-down voltages; a first delay path configured to generate the pull-down enable signal by delaying an input signal; and a second delay path configured to generate the pull-up enable signal by delaying the input signal, wherein a change in a delay of the first delay path due to variation of a power supply voltage is smaller than a change in a delay of the second delay path due to the variation.

12 Claims, 6 Drawing Sheets

INTEGRATED CIRCUIT AND MEMORY

CROSS-REFERENCE TO RELATED APPLICATION

The present application is a continuation-in-part application of U.S. patent application Ser. No. 16/713,336 filed on Dec. 13, 2019, which claims priority to Korean Patent Application No. 10-2018-0169387 filed on Dec. 26, 2018. The disclosure of each of the foregoing applications is herein incorporated herein by reference in its entirety.

BACKGROUND

1. Field

Various embodiments relate to circuit design technology.

2. Discussion of the Related Art

A memory device performs operations of writing data inputted from an external source and reading stored (written) data. A basic unit for storing data is called a cell, and the memory device includes one capacitor to store one bit or piece of data. In order to read data stored in the capacitor and accurately transfer the read data to an external source, it is necessary to accurately determine the polarity of the data stored in the cell. The memory device includes a bit line sense amplifier (BLSA) as an amplifier circuit that determines data polarity and amplifies data.

The bit line sense amplifier amplifies a voltage difference between a bit line and a bit line bar, and if there is any potential difference (dV) between the bit line and the bit line bar, the bit line sense amplifier needs to accurately sense and amplify the potential difference (dV), but in reality, the bit line sense amplifier may not accurately sense and amplify the potential difference. A minimum potential difference (dV) across the bit line pair for a correct operation of the bit line sense amplifier is called an offset. When the potential difference across the bit line pair is smaller than the offset, the bit line sense amplifier may not perform correct amplification and sensing operations.

SUMMARY

Various embodiments are directed to a technology for reducing an offset of a bit line sense amplifier.

In an embodiment, an integrated circuit may include an amplifier circuit configured to receive a pull-up voltage in response to a pull-up enable signal, receive a pull-down voltage in response to a pull-down enable signal, and amplify a voltage difference between a first line and a second line through the pull-up and pull-down voltages; a first delay path configured to generate the pull-up enable signal by delaying an input signal; and a second delay path configured to generate the pull-down enable signal by delaying the input signal, wherein a change in a delay of the first delay path due to variation of a power supply voltage is smaller than a change in a delay of the second delay path due to the variation.

In another embodiment, a memory may include a bit line sense amplifier configured to receive a pull-up voltage in response to a pull-up enable signal, receive a pull-down voltage in response to a pull-down enable signal, and amplify a voltage difference between a bit line and a bit line bar through the pull-up and pull-down voltages; and an enable signal generation circuit configured to generate the pull-up enable signal and the pull-down enable signal, and to activate the pull-up enable signal earlier than the pull-down enable signal as a power supply voltage decreases.

In another embodiment, an integrated circuit may include an amplifier circuit configured to pull-up a voltage of a first line in response to a pull-up enable signal and pull-down a voltage of a second line in response to a pull-down enable signal; a delay control circuit configured to generate the pull-up and pull-down enable signals by delaying a reference signal by first and second delays, respectively, wherein the first delay is less than the second delay, and wherein a difference between the first and second delays varies inversely with respect to variation of a power supply voltage.

In another embodiment, an operation method of an integrated circuit may include generating pull-up and pull-down enable signals by delaying a reference signal by first and second delays, respectively; pulling-up a voltage of a first line in response to the pull-up enable signal; and pulling-down a voltage of a second line in response to the pull-down enable signal, wherein the first delay is less than the second delay, and wherein difference between the first and second delays varies inversely with respect to variation of a power supply voltage.

In another embodiment, an integrated circuit may include, an amplifier circuit configured to receive a pull-up voltage in response to a pull-up enable signal, receive a pull-down voltage in response to a pull-down enable signal, and amplify a voltage difference between a first line and a second line through the pull-up and pull-down voltages; a first delay path configured to generate the pull-down enable signal by delaying an input signal; and a second delay path configured to generate the pull-up enable signal by delaying the input signal, wherein a change in a delay of the first delay path due to variation of a power supply voltage is smaller than a change in a delay of the second delay path due to the variation.

In another embodiment, a memory may include, a bit line sense amplifier configured to receive a pull-up voltage in response to a pull-up enable signal, receive a pull-down voltage in response to a pull-down enable signal, and amplify a voltage difference between a bit line and a bit line bar through the pull-up and pull-down voltages; and an enable signal generation circuit configured to generate the pull-up enable signal and the pull-down enable signal, and to activate the pull-down enable signal earlier than the pull-up enable signal as a power supply voltage decreases.

In accordance with the embodiments, it is possible to reduce an offset of a bit line sense amplifier.

DETAILED DESCRIPTION

Figure 1A:
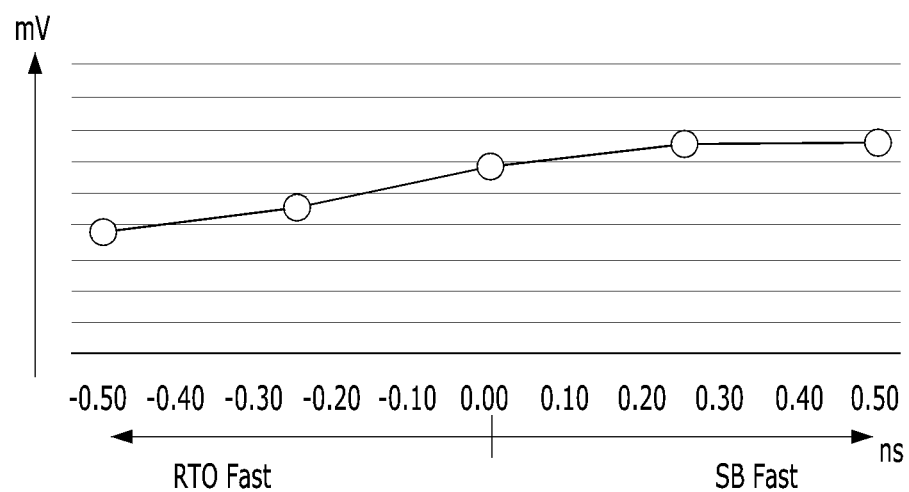
FIGS. 1A, 1B, and 1C are diagrams illustrating a change in an offset of a bit line sense amplifier in an RTO fast condition and an SB fast condition.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

Throughout the specification, when one element is referred to as being 'connected to' or 'coupled to' another element, it may indicate that the former element is directly connected or coupled to the latter element or electrically connected or coupled to the latter element with one or more elements interposed therebetween. Furthermore, when an element "includes" or "comprises" a component, it does not mean that one or more other non-stated components are excluded; rather, the element may further include or comprise such other component(s), unless stated or the context indicates otherwise. Moreover, in many examples reference to a component in the singular is intended to also include plural instances of such component. The articles 'a' and 'an' as used in this application and the appended claims should generally be construed to mean "one or more unless specified otherwise or clear from context to be directed to a singular form.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

Figure 1B:
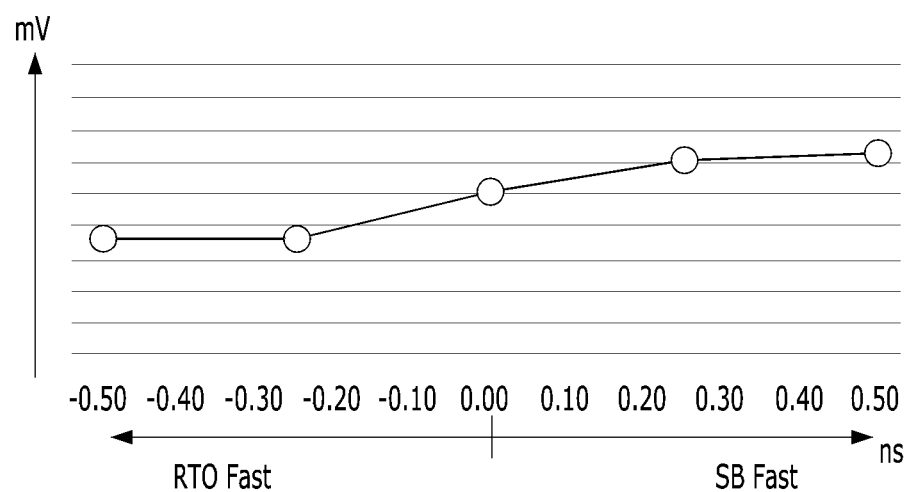
Figure 1C:
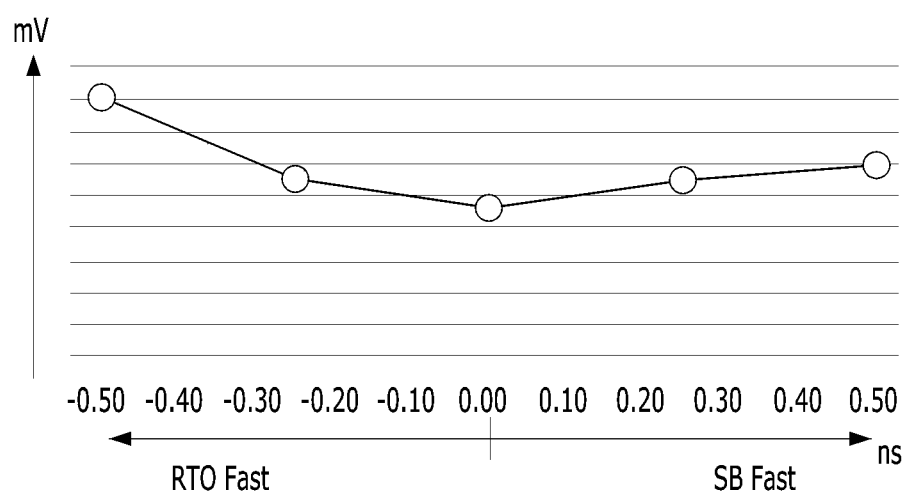

FIGS. 1A, 1B, and 1C are diagrams illustrating a change in an offset of a bit line sense amplifier in an RTO fast condition and an SB fast condition. The RTO fast condition may refer to a condition in which pull-up power is supplied to the bit line sense amplifier earlier than pull-down power, and the SB fast condition may refer to a condition in which the pull-down power is supplied to the bit line sense amplifier earlier than the pull-up power.

FIG. 1A may illustrate a change in the offset of the bit line sense amplifier in the RTO fast condition and the SB fast condition when a power supply voltage VDD is low (for example, 1.04 V). Referring to FIG. 1A, it can be confirmed that the offset of the bit line sense amplifier is the largest in the SB fast condition in which the pull-down power is supplied 50 ns earlier than the pull-up power. The offset is reduced as the SB fast condition is changed to the RTO fast condition, and it can be confirmed that the offset is further reduced when the pull-down power and the pull-up power are simultaneously supplied and the offset of the bit line sense amplifier has a minimum value in the RTO fast condition in which the pull-up power is supplied 50 ns earlier than the pull-down power.

FIG. 1B may illustrate a change in the offset of the bit line sense amplifier in the RTO fast condition and the SB fast condition when the power supply voltage VDD is intermediate (for example, 1.20 V). Referring to FIG. 1B, it can be confirmed that the offset of the bit line sense amplifier is the largest in the SB fast condition in which the pull-down power is supplied 50 ns earlier than the pull-up power. The offset is reduced as the SB fast condition is changed to the RTO fast condition, and it can be confirmed that the offset is further reduced when the pull-down power and the pull-up power are simultaneously supplied and the offset of the bit line sense amplifier has a minimum value in the RTO fast condition in which the pull-up power is supplied 50 ns earlier than the pull-down power.

FIG. 1C may illustrate a change in the offset of the bit line sense amplifier in the RTO fast condition and the SB fast condition when the power supply voltage VDD is high (for example, 1.50 V). Referring to FIG. 1C, it can be confirmed that the offset of the bit line sense amplifier is large in the SB fast condition in which the pull-down power is supplied 50 ns earlier than the pull-up power. It can be confirmed that the offset is reduced when the pull-down power and the pull-up power are simultaneously supplied. However, it can be confirmed that the offset of the bit line sense amplifier is greatly increased and has a maximum value in the RTO fast condition in which the pull-up power is supplied 50 ns earlier than the pull-down power.

Referring to FIGS. 1A to 1C, it can be confirmed that, in order to minimize the offset of the bit line sense amplifier, it is necessary to set the operation condition of the bit line sense amplifier to a hard RTO fast condition in a normal condition of the power supply voltage VDD and to set the operation condition of the bit line sense amplifier to a soft RTO fast condition when the power supply voltage VDD is high. In the hard RTO fast condition, the pull-up power is supplied to the bit line sense amplifier much earlier (e.g., 0.50 ns earlier) than pull-down power. In the soft RTO fast condition, the pull-up power is supplied to the bit line sense amplifier a little bit earlier (e.g., 0.10 ns earlier) than pull-down power.

In an embodiment, it is necessary to set the operation condition of the bit line sense amplifier to a hard RTO fast condition in a normal condition of the power supply voltage VDD and to set the operation condition of the bit line sense amplifier to a soft SB fast condition when the power supply voltage VDD is high. In the soft SB fast condition, the pull-down power is supplied to the bit line sense amplifier a little bit earlier (e.g., 0.10 ns earlier) than pull-up power.

Figure 2:
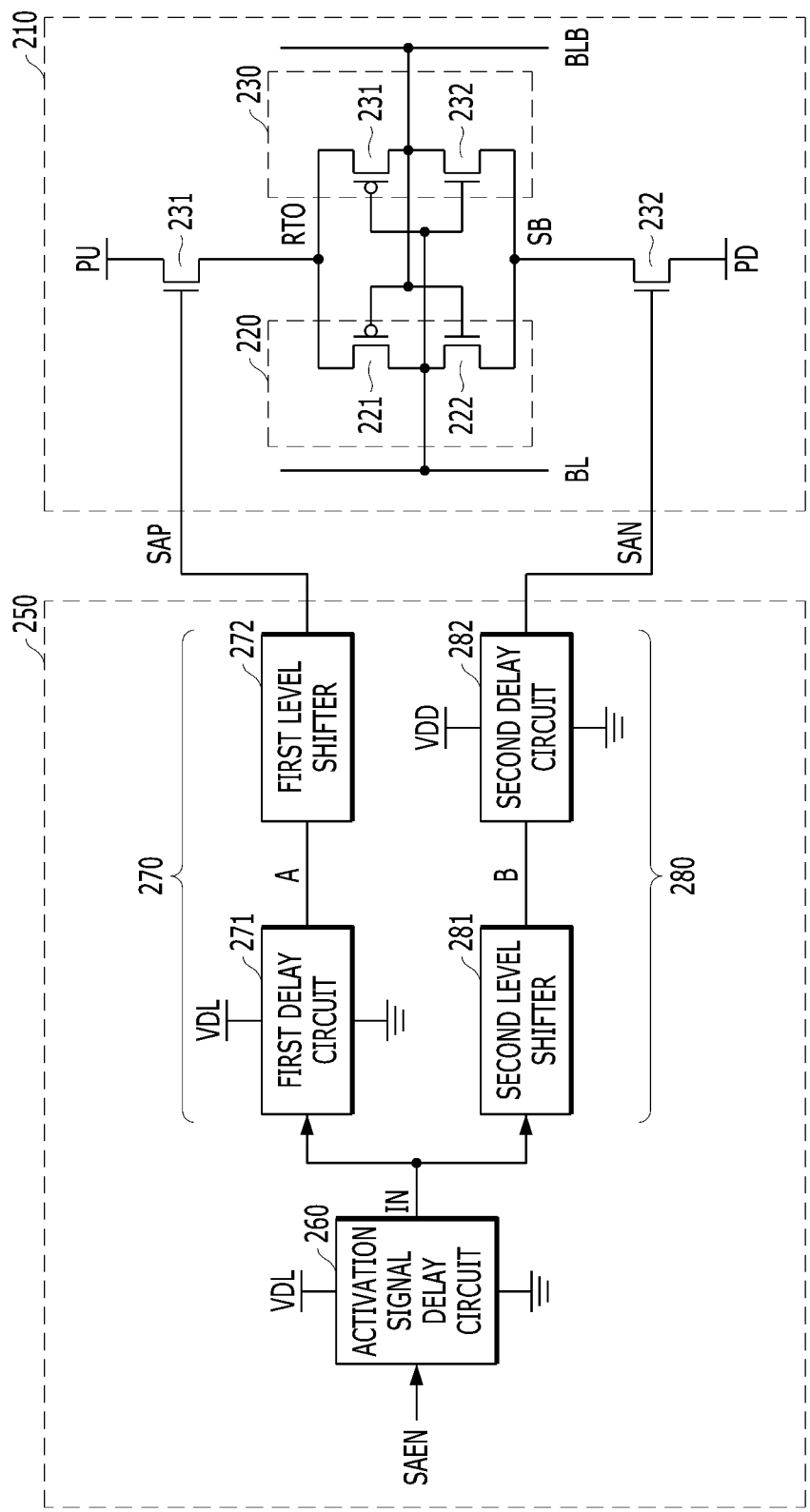
FIG. 2 is a schematic diagram illustrating a configuration of a memory in accordance with an embodiment.

FIG. 2 is a schematic diagram of a configuration of a memory in accordance with an embodiment.

Referring to FIG. 2, the memory may include a bit line sense amplifier 210 and an enable signal generation circuit 250.

The bit line sense amplifier 210 may include a first inverter 220 and a second inverter 230 electrically connected in a cross-coupled manner between a bit line BL and a bit line bar BLB. The first inverter 220 may include a PMOS transistor 221 and an NMOS transistor 222 and the second inverter 230 may include a PMOS transistor 231 and an NMOS transistor 232, and a voltage difference between the bit line and the bit line bar may be sensed and amplified by the first inverter 220 and the second inverter 230.

The NMOS transistor 231 may supply a pull-up voltage PU to a pull-up voltage terminal RTO when a pull-up enable signal SAP is enabled. The pull-up voltage PU may be the power supply voltage VDD or a core voltage VCORE having a level lower than that of the power supply voltage. The NMOS transistor 232 may supply a pull-down voltage PD to a pull-down voltage terminal SB when a pull-down enable signal SAN is enabled. The pull-down voltage PD may be a ground voltage. As a consequence, when the pull-up enable signal SAP is enabled, the pull-up voltage may be supplied to the bit line sense amplifier 210, and when the pull-down enable signal SAN is enabled, the pull-down voltage may be supplied to the bit line sense amplifier 210.

The enable signal generation circuit 250 may generate the pull-up enable signal SAP and the pull-down enable signal SAN. The enable signal generation circuit 250 may adjust activation timings of the pull-up enable signal SAP and the pull-down enable signal SAN such that the status of the bit line sense amplifier 210 becomes the hard RTO fast condition as the power supply voltage VDD decreases and becomes the soft RTO fast or the soft SB fast condition as the power supply voltage VDD increases. That is, as the power supply voltage VDD decreases, the time difference from the activation timing of the pull-up enable signal SAP to the activation timing of the pull-down enable signal SAN may increase, and as the power supply voltage VDD increases, the time difference from the activation timing of the pull-up enable signal SAP to the activation timing of the pull-down enable signal SAN may decrease.

The enable signal generation circuit 250 may include an enable signal delay circuit 260, a first delay path 270, and a second delay path 280.

The enable signal delay circuit 260 may generate an input signal IN by delaying a sense amplifier enable signal SAEN. The sense amplifier enable signal SAEN may be a signal for enabling the bit line sense amplifier 210. The enable signal delay circuit 260 may operate using a constant voltage VDL in order to have a constant delay value or amount even though the power supply voltage VDD fluctuates. The constant voltage VDL is a voltage always having a constant voltage level regardless of the variation of the power supply voltage VDD, and may be generated in a bandgap circuit.

The first delay path 270 may generate the pull-up enable signal SAP by delaying the input signal IN. The second delay path 280 may generate the pull-down enable signal SAN by delaying the input signal IN. A delay amount of the first delay path 270 due to the variation of the power supply voltage VDD may be smaller than a delay amount of the second delay path 280 due to the variation of the power supply voltage VDD. For example, the delay amount of the second delay path 280 is reduced as the power supply voltage VDD increases, but the delay amount of the first delay path 270 may remain substantially constant even when the power supply voltage VDD increases. Due to such delay characteristics of the first delay path 270 and the second delay path 280, the time difference from the activation timing of the pull-up enable signal SAP to the activation timing of the pull-down enable signal SAN may increase as the power supply voltage VDD decreases, and may decrease as the power supply voltage VDD increases.

The first delay path 270 may include a first delay circuit 271 and a first level shifter 272. Since the first delay circuit 271 delays the input signal IN and operates using the constant voltage VDL, the first delay circuit 271 may have a constant delay amount regardless of the variation of the power supply voltage VDD. Since the first delay circuit 271 operates using the constant voltage VDL, an output signal A of the first delay circuit 271 swings between the ground voltage and the constant voltage VDL. The first level shifter 272 may level-shift the output signal A of the first delay circuit 271 to swing between the ground voltage and the constant voltage VDL, and the signal level-shifted by the first level shifter 272 may be the pull-up enable signal SAP.

The second delay path 280 may include a second level shifter 281 and a second delay circuit 282. The second level shifter 281 may level-shift the input signal IN to swing between the ground voltage and the power supply voltage VDD. Since the input signal IN is an output signal of the enable signal delay circuit 260 using the constant voltage VDL, the input signal IN swings between the ground voltage and the constant voltage VDL and an output signal B of the second level shifter 281 may swing between the ground voltage and the power supply voltage VDD by the second level shifter 281. The second delay circuit 282 may generate the pull-down enable signal SAN by delaying the output signal B of the second level shifter 281. Since the second delay circuit 282 operates using the power supply voltage VDD, a delay amount of the second delay circuit 282 may decrease as the power supply voltage VDD increases and increase as the power supply voltage VDD decreases.

FIG. 2 illustrates a case where the memory reduces the offset of the bit line sense amplifier 210 that is an amplifier circuit that amplifies the voltage difference between the two bit lines BL and BLB; however, it is of course that the embodiment may also be applied in order for a general integrated circuit, instead of the memory, to reduce the offset of an amplifier circuit that amplifies a voltage difference between two lines.

Figure 3:
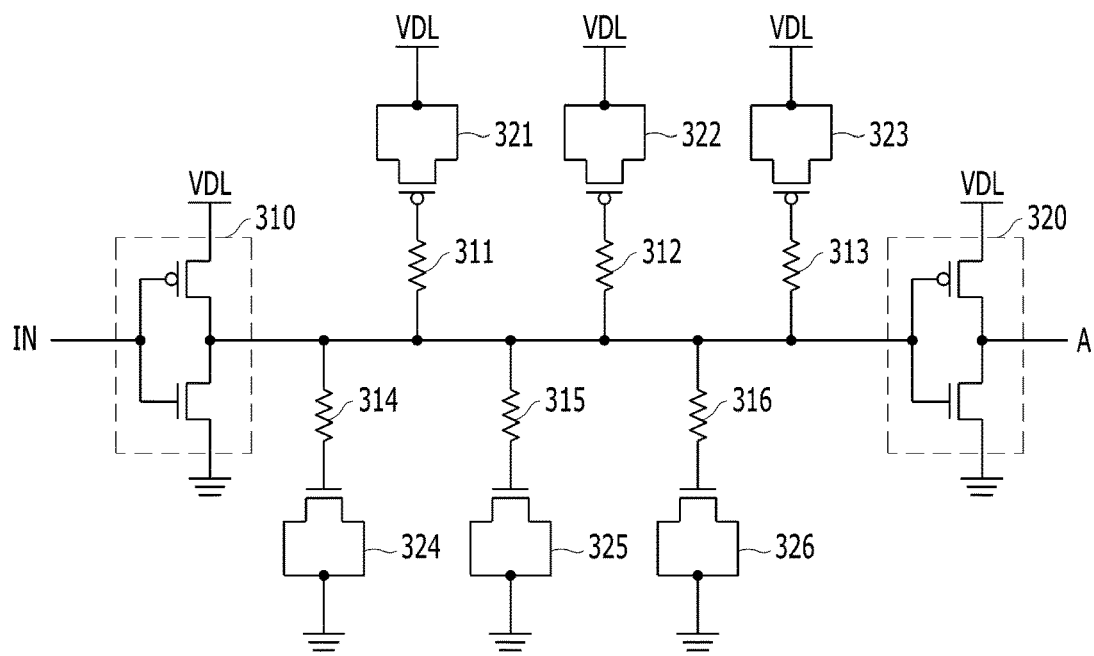
FIG. 3 is a configuration diagram of an embodiment of a first delay circuit 271 of FIG. 2.

FIG. 3 is a schematic diagram of an embodiment of the first delay circuit 271 of FIG. 2.

Referring to FIG. 3, the first delay circuit 271 may include inverters 310 and 320, resistors 311 to 316, and capacitors 321 to 326.

The inverter 310 operates using the constant voltage VDL and the ground voltage, and may invert and output the input signal IN.

The resistors 311 to 316 may be electrically connected to an output terminal of the inverter 310. The capacitors 321 to 323 may be electrically connected to the resistors 311 to 313. Each of the capacitors 321 to 323 may be a PMOS transistor in which a drain and a source are electrically connected to each other, and the constant voltage VDL may be applied to the drain and the source. The capacitors 324 to 326 may be electrically connected to the resistors 314 to 316. Each of the capacitors 324 to 326 may be an NMOS transistor in which a drain and a source are electrically connected to each other, and the ground voltage may be applied to the drain and the source. The resistors 314 to 316 and the capacitors 324 to 326 may generate an RC delay, so that an output signal of the inverter 310 may be delayed.

The inverter 320 may invert a signal delayed by the resistors 314 to 316 and the capacitors 324 to 326 and output the inverted signal as the output signal A.

Since the constant voltage VDL that substantially maintains a constant voltage level is used in the first delay circuit 271, the first delay circuit 271 may also have a constant delay amount.

Figure 4:
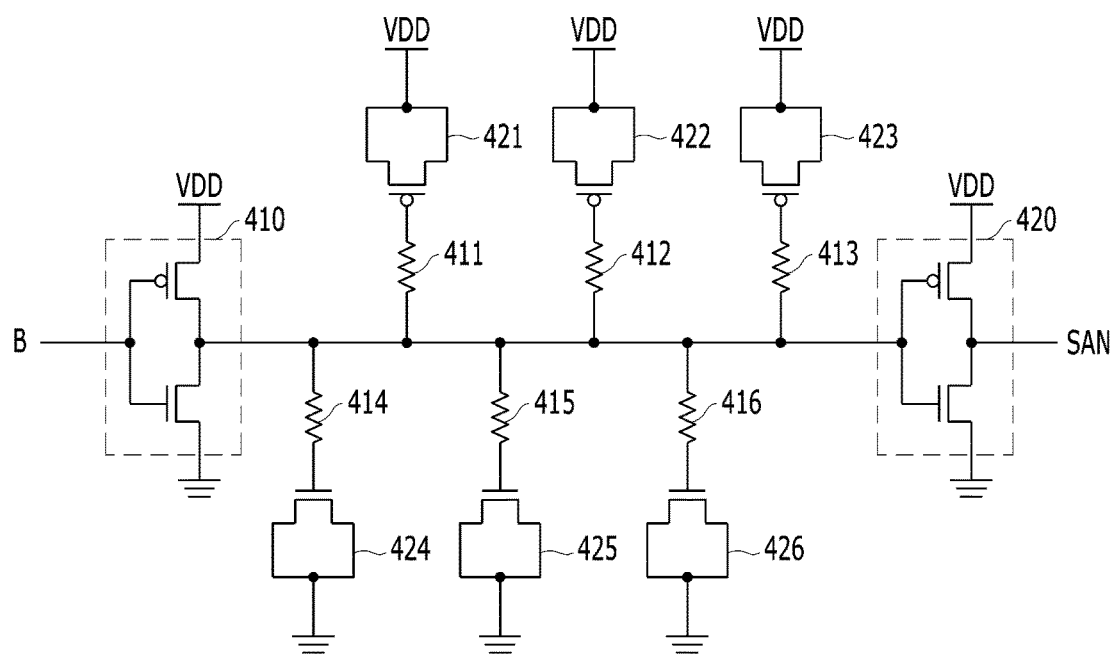
FIG. 4 is a schematic diagram of a second delay circuit, such as that of FIG. 2, in accordance with an embodiment.

FIG. 4 is a schematic diagram of an embodiment of the second delay circuit 282 of FIG. 2.

Referring to FIG. 4, the second delay circuit 282 may include inverters 410 and 420, resistors 411 to 416, and capacitors 421 to 426.

The inverter 410 operates using the power supply voltage VDD and the ground voltage, and may invert and output the signal B.

The resistors 411 to 416 may be electrically connected to an output terminal of the inverter 410. The capacitors 421 to 423 may be electrically connected to the resistors 411 to 413. Each of the capacitors 421 to 423 may be a PMOS transistor in which a drain and a source are electrically connected to each other, and the power supply voltage VDD may be applied to the drain and the source. The capacitors 424 to 426 may be electrically connected to the resistors 414 to 416. Each of the capacitors 424 to 426 may be an NMOS transistor in which a drain and a source are electrically connected to each other, and the ground voltage may be applied to the drain and the source. The resistors 414 to 416 and the capacitors 424 to 426 may generate an RC delay, so that an output signal of the inverter 410 may be delayed.

The inverter 420 may invert a signal delayed by the resistors 414 to 416 and the capacitors 424 to 426 and output the inverted signal as the pull-down enable signal SAN.

Since the power supply voltage VDD is used in the second delay circuit 282 and the amount of a current and the like used for charging/discharging the capacitors 421 to 426 by the inverter 410 fluctuates in accordance with the variation of the power supply voltage VDD, a delay amount of the second delay circuit 282 may also fluctuate in accordance with the power supply voltage VDD. That is, the delay amount of the second delay circuit 282 may decrease as the power supply voltage VDD increases, and may increase as the power supply voltage VDD decreases.

Figure 5:
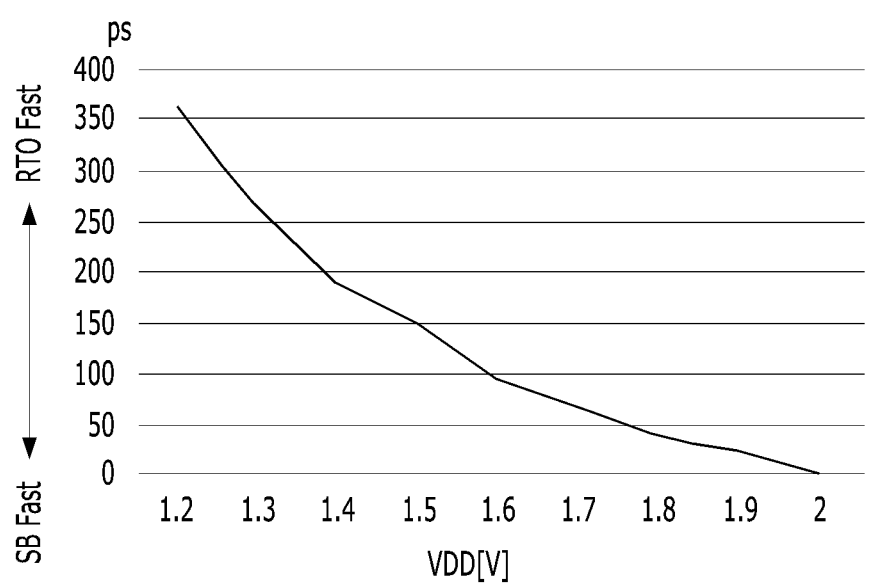
FIG. 5 is a diagram illustrating a change in the RTO fast condition according to variation of a power supply voltage VDD in a memory, such as that of FIG. 2, in accordance with an embodiment.

FIG. 5 is a diagram illustrating a change in the RTO fast condition in accordance with the power supply voltage VDD in the memory of FIG. 2. The Y-axis in FIG. 5 represents the difference in time between when the pull-up power is provided and when the pull-down power is later provided. As the time difference increases operation transitions toward a harder RTO fast condition and as the time difference decreases operation transitions toward a softer RTO fast condition. Although not illustrated, Y-axis may be extended to the region of the soft SB condition.

Referring to FIG. 5, it can be confirmed that since the first delay path 270 has a constant delay amount while the second path 280 has a greater delay amount as the power supply voltage VDD decreases, the bit line sense amplifier 210 embodies the harder RTO fast characteristic such that the time difference from the activation timing of the pull-up enable signal SAP to the activation timing of the pull-down enable signal SAN becomes greater.

However, it can be confirmed that since the first delay path 270 has a constant delay amount while the second path 280 has a lesser delay amount as the power supply voltage VDD increases, the bit line sense amplifier 210 has the softer RTO fast characteristic such that the time difference from the activation timing of the pull-up enable signal SAP to the activation timing of the pull-down enable signal SAN becomes shorter.

Although not illustrated, as the first delay path 270 has the constant delay amount while the second path 280 has a lesser delay amount as the power supply voltage VDD increases, the bit line sense amplifier 210 has the soft SB fast characteristic of the short time difference from the activation timing of the pull-down enable signal SAN to the activation timing of the pull-up enable signal SAP.

In accordance with another embodiment of the present invention, an integrated circuit may include an amplifier circuit and a delay control circuit.

The amplifier circuit may correspond to the bit line sense amplifier 210 but is not limited thereto. The amplifier circuit may pull-up a voltage of a first line in response to a pull-up enable signal and pull-down a voltage of a second line in response to a pull-down enable signal to amplify voltage difference between the first and second lines. The pull-up enable signal and the pull-down enable signal may correspond to the pull-up enable signal SAP and the pull-down enable signal SAN, respectively, but are not limited thereto.

The delay control circuit may correspond to the enable signal generation circuit 250 but not limited thereto. The delay control circuit may generate the pull-up and pull-down enable signals by delaying a reference signal by first and second delay amounts, respectively. The reference signal may correspond to the input signal IN but is not limited thereto.

The delay control circuit may control the first delay amount as less than the second delay amount. Therefore, the pull-up enable signal may be activated earlier than the pull-down enable signal.

Further, the delay control circuit may control the difference between the first and second delay amounts to inversely depend on variation of a power supply voltage, which is similar to the characteristics of the pull-up enable signal SAP and the pull-down enable signal SAN to the power supply voltage VDD, as illustrated in FIG. 5.

The delay control circuit may control the first delay amount as substantially fixed by generating the pull-up enable signal based on a constant voltage, such as the first delay circuit 271 operable according to the constant voltage VDL.

The delay control circuit may control the second delay amount to inversely depend on the variation of the power supply voltage by generating the pull-down enable signal based on the power supply voltage, such as the second delay circuit 282 operable according to the power supply voltage VDD.

When the delay control circuit generates the pull-up and pull-down enable signals by delaying the reference signal by the first and second delay amounts, respectively, the amplifier circuit may pull-up the voltage of the first line in response to the pull-up enable signal and pull-down the voltage of the second line in response to the pull-down enable signal.

In accordance with an embodiment of the present invention, the difference between the first and second delay amounts may become greater as the power supply voltage decreases and thus a time gap from activation of the first enable signal to activation of the second enable signal may become greater and the amplifier may become of harder RTO fast characteristic.

In accordance with an embodiment of the present invention, the difference between the first and second delay amounts may become less as the power supply voltage increases, and thus the time gap from activation of the first enable signal to activation of the second enable signal may become less and the amplifier may become of softer RTO fast characteristic or the first enable signal may be activated little bit later than the second enable signal and the amplifier may become of soft SB fast characteristic.

Figure 6:
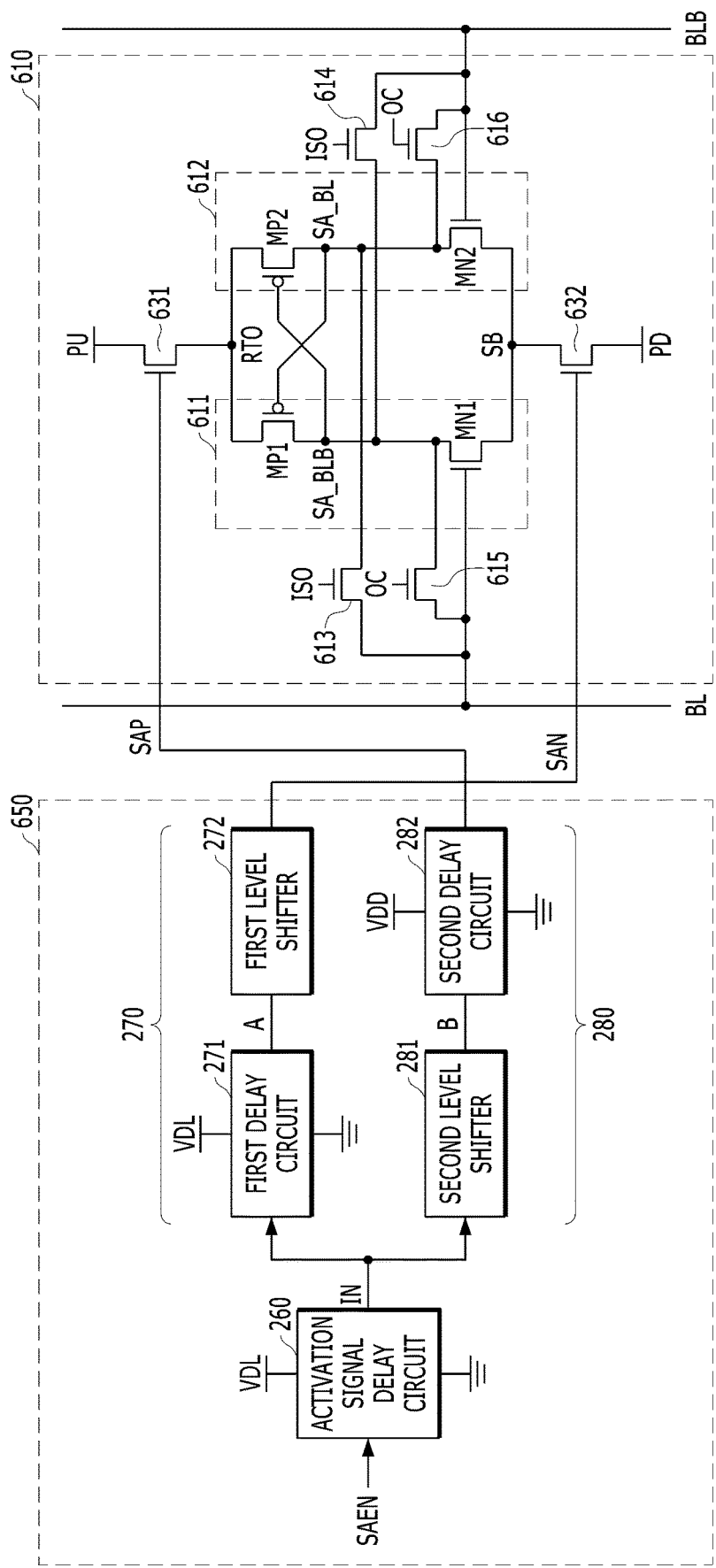
FIG. 6 is a schematic diagram illustrating a configuration of a memory in accordance with another embodiment.

FIG. 6 is a schematic diagram illustrating a configuration of a memory in accordance with another embodiment of the present invention.

Referring to FIG. 6, the memory may include a bit line sense amplifier 610 and an enable signal generation circuit 650.

The embodiment of FIG. 2 illustrates a case where the activation timings of the pull-down enable signal SAN is faster than those of the pull-up enable signal SAP, as the level of the power supply voltage VDD increases. However, the optimal condition for activating the bit line sense amplifier may be changed according to the design and type of the bit line sense amplifier. For example, in the case of the MC (Mismatch Cancellation)-type bit line sense amplifier 610 illustrated in FIG. 6, unlike the bit line sense amplifier 210 of FIG. 2, it may be advantageous for the pull-up enable signal SAP to have a faster activation timing than the pull-down enable signal SAN, as the level of the power supply voltage VDD increases.

The enable signal generation circuit 650 may generate a pull-up enable signal SAP and a pull-down enable signal SAN. The enable signal generation circuit 650 may adjust the activation timings of the pull-up enable signal SAP and the pull-down enable signal SAN so that the SB fast tendency may become stronger as the level of the power supply voltage VDD becomes lower, and the RTO fast tendency may become stronger as the level of the power supply voltage VDD becomes higher. In other words, as the level of the power supply voltage VDD increases, the activation timing of the pull-up enable signal SAP may tend to become faster than the activation timing of the pull-down enable signal SAN, and as the level of the power supply voltage VDD becomes lower, the activation timing of the pull-up enable signal SAP may tend to be slower than the activation timing of the pull-down enable signal SAN.

Just like the enable signal generation circuit 250 of FIG. 2, the enable signal generation circuit 650 may include an enable signal delay circuit 260, a first delay path 270, and a second delay path 280. Also, as illustrated in FIG. 2, the first delay path 270 may include a first delay circuit 271 and a second level shifter 272, and the second delay path 280 may include a second level shifter 281 and a second delay circuit 282. However, contrary to what is shown in FIG. 2, a pull-down enable signal SAN may be generated in the first delay path 270, and a pull-up enable signal SAP may be generated in the second delay path 280.

The bit line sense amplifier 610 may operate based on the voltage supplied to a pull-up power terminal RTO and a pull-down power terminal SB, reflect its offset into the first bit line BL and the second bit line BLB in an offset canceling section, and amplify the voltage difference between the first bit line BL and the second bit line BLB in an amplification section. The bit line sense amplifier circuit 610 may include a first amplifier 611, a second amplifier 612, isolation switches 613 and 614, and offset canceling switches 615 and 616. The NMOS transistor 631 may supply the pull-up voltage PU to the pull-up voltage terminal RTO when the pull-up enable signal SAP is activated. Here, the pull-up voltage PU may be a power supply voltage VDD or a core voltage VCORE having a lower level than the power source voltage. The NMOS transistor 632 may supply the pull-down voltage PD to the pull-down voltage terminal SB when the pull-down enable signal SAN is activated. Here, the pull-down voltage PD may be a ground voltage. After all, when the pull-up enable signal SAP is activated, a pull-up voltage may be supplied to the bit line sense amplifier 610, and when the pull-down enable signal SAN is activated, the pull-down voltage may be supplied to the bit line sense amplifier 610. The bit line sense amplifier 610 may perform an offset cancel operation in which the offset of the bit line sense amplifier 610 is reflected into the first bit line BL and the second bit line BLB in the offset cancelling section, and perform an amplification operation for amplifying a voltage difference between the first bit line BL and the second bit line BLB in the amplification section. For this reason, the bit line sense amplifier 610 may be referred to as a mismatch cancellation type.

The first amplifier 611 may drive the second bit line BLB by inverting the voltage of the first bit line BL in the amplification section. The first amplifier 611 may operate based on the voltage of the pull-up voltage terminal RTO and the voltage of the pull-down voltage terminal SB. The amplification operation of the first amplifier 611 may be activated when voltages required for the operation are supplied to the pull-up voltage terminal RTO and the pull-down voltage terminal SB and when the isolation switches 613 and 614 are turned on. The first amplifier 611 may include a first NMOS transistor MN1 and a first PMOS transistor MP1. The first NMOS transistor MN1 may drive the second inner node SA_BLB based on the voltage of the pull-down voltage terminal SB in response to the voltage of the first bit line BL. The first PMOS transistor MP1 may drive the second inner node SA_BLB based on the voltage of the pull-up voltage terminal RTO in response to the voltage of the first inner node SA_BL.

The second amplifier 612 may drive the first bit line BL by inverting the voltage of the second bit line BLB when an amplification operation is activated. The second amplifier 612 may operate based on the voltage of the pull-up voltage terminal RTO and the voltage of the pull-down voltage terminal SB. The amplification operation of the second amplifier 612 may be activated when voltages required for the operation are supplied to the pull-up voltage terminal RTO and the pull-down voltage terminal SB, and the isolation switches 613 and 614 are turned on. The second amplifier 612 may include a second NMOS transistor MN2 and a second PMOS transistor MP2. The second NMOS transistor MN2 may drive the first inner node SA_BL based on the voltage of the pull-down voltage terminal SB in response to the voltage of the second bit line BLB. The second PMOS transistor MP2 may drive the first inner node SA_BL based on the voltage of the pull-up voltage terminal RTO in response to the voltage of the second inner node SA_BLB.

The first isolation switch 613 may electrically connect the first bit line BL and the first inner node SA_BL in response to an isolation signal ISO, and the second isolation switch 614 may electrically connect the second bit line BLB and the second inner node SA_BLB in response to the isolation signal ISO. The isolation switches 613 and 614 may be turned on when the isolation signal ISO is activated to a logic high level and may be turned off when the isolation signal ISO is deactivated to a logic low level.

The first offset canceling switch 615 may electrically connect the first bit line BL and the second inner node SA_BLB in response to an offset canceling signal OC, and the second offset canceling switch 616 may electrically connect the second bit line BLB and the first inner node SA_BL in response to the offset canceling signal OC.

In an offset canceling section of the bit line sense amplifier 610, the pull-up enable signal SAP and the pull-down enable signal SAN may be activated to supply power to the bit line sense amplifier 610, deactivate the isolation signal ISO, and activate the offset canceling signal OC. During the offset canceling period, an offset (i.e., mismatch) of the bit line sense amplifier 610 may be reflected into the first bit line BL and the second bit line BLB.

In an amplification section of the bit line sense amplifier 610, the pull-up enable signal SAP and the pull-down enable signal SAN may be activated to supply power to the bit line sense amplifier 610, deactivate the offset canceling signal OC, and activate the isolation signal ISO. During the amplification section, the bit line sense amplifier 610 may amplify a voltage difference between the first bit line BL and the second bit line BLB.

In FIG. 6, the bit line sense amplifier 610 is illustrated as a mismatch cancel type, but it is obvious to those skilled in the art to which the present invention pertains that a bit line sense amplifier of a different type and a different design may be used.

Although various embodiments have been illustrated and described, it will be apparent to those skilled in the art in light of the present disclosure that various changes and modifications may be made without departing from the spirit and scope of the invention as defined in the following claims.

What is claimed is:

1. An integrated circuit comprising:
an amplifier circuit configured to receive a pull-up voltage in response to a pull-up enable signal, receive a pull-down voltage in response to a pull-down enable signal, and amplify a voltage difference between a first line and a second line through the pull-up and pull-down voltages;
a first delay path configured to generate the pull-down enable signal by delaying an input signal; and
a second delay path configured to generate the pull-up enable signal by delaying the input signal,
wherein a change in a delay of the first delay path due to variation of a power supply voltage is smaller than a change in a delay of the second delay path due to the variation.

2. The integrated circuit of claim 1, wherein the delay of the second delay path decreases as the power supply voltage increases.

3. The integrated circuit of claim 2, wherein the delay of the first delay path remains constant.

4. The integrated circuit of claim 2, wherein the delay of the first delay path decreases as the power supply voltage increases, the decrease of the delay of the first delay path being less than a decrease of the delay of the second delay path as the power supply voltage increases.

5. The integrated circuit of claim 1,
wherein the first delay path includes a first delay circuit for delaying the input signal,
wherein the first delay circuit operates using a constant voltage,
wherein the second delay path includes a second delay circuit for delaying the input signal, and
wherein the second delay circuit operates using the power supply voltage.

6. The integrated circuit of claim 5,
wherein the input signal swings between a ground voltage and the constant voltage,
wherein the first delay path further includes a first level shifter for changing an output signal of the first delay circuit to swing between the ground voltage and the power supply voltage, and
wherein the second delay path further includes a second level shifter for changing the input signal to swing between the ground voltage and the power supply voltage and transferring the changed input signal to the second delay circuit.

7. The integrated circuit of claim 6, further comprising:
an enable signal delay circuit configured to generate the input signal by delaying a sense amplifier enable signal based on the constant voltage.

8. The integrated circuit of claim 1,
wherein the first line is a bit line,
wherein the second line is a bit line bar,
wherein the amplifier circuit is a bit line sense amplifier, and
wherein the integrated circuit is a memory.

9. The integrated circuit of claim 8,
wherein the bit line sense amplifier is a mismatch cancellation type.

10. A memory comprising:
a bit line sense amplifier configured to receive a pull-up voltage in response to a pull-up enable signal, receive a pull-down voltage in response to a pull-down enable signal, and amplify a voltage difference between a bit line and a bit line bar through the pull-up and pull-down voltages; and
an enable signal generation circuit configured to generate the pull-up enable signal and the pull-down enable signal, and to activate the pull-down enable signal earlier than the pull-up enable signal as a power supply voltage decreases.

11. The memory of claim 10, wherein the enable signal generation circuit activates the pull-up enable signal earlier than the pull-down enable signal as the power supply voltage increases.

12. The memory of claim 10, wherein the bit line sense amplifier is a mismatch cancellation type.

* * * * *